United States Patent
Mikhailov et al.

(10) Patent No.: US 11,899,098 B2
(45) Date of Patent: Feb. 13, 2024

(54) SYSTEM AND METHOD FOR TESTING A RADAR UNDER TEST

(71) Applicant: Rohde & Schwarz GmbH & Co. KG, Munich (DE)

(72) Inventors: Yassen Stefanov Mikhailov, Starnberg (DE); Steffen Neidhardt, Dorfen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 326 days.

(21) Appl. No.: 16/542,833

(22) Filed: Aug. 16, 2019

(65) Prior Publication Data

US 2020/0393559 A1 Dec. 17, 2020

(30) Foreign Application Priority Data

Jun. 11, 2019 (EP) .................... 19179340

(51) Int. Cl.
| | | |
|---|---|---|
| *G01S 13/89* | (2006.01) | |
| *G01S 13/935* | (2020.01) | |
| *G01C 21/00* | (2006.01) | |
| *H01Q 3/26* | (2006.01) | |
| *G01S 7/28* | (2006.01) | |

(Continued)

(52) U.S. Cl.
CPC ........... *G01S 13/89* (2013.01); *G01C 21/005* (2013.01); *G01S 13/935* (2020.01); *H01Q 3/267* (2013.01); *G01S 7/2813* (2013.01); *G01S 2013/0254* (2013.01); *H01Q 3/36* (2013.01)

(58) Field of Classification Search
CPC .......... H01Q 3/267; H01Q 3/34; H01Q 3/46; H01Q 3/36; H01Q 3/38; G01S 13/89; G01S 2013/0254; G01S 7/40; G01S 7/4017; G01S 7/4026; G01S 7/2813; G01R 29/08; G01R 29/10; G01R 29/0821; G01R 29/105
USPC ......... 342/165, 179, 174, 455, 562.1, 575.7; 455/562.1, 575.7
See application file for complete search history.

(56) References Cited

U.S. PATENT DOCUMENTS

| | | | | |
|---|---|---|---|---|
| 4,488,155 A | * | 12/1984 | Wu | ............. H01Q 3/267 342/174 |
| 5,204,685 A | * | 4/1993 | Franchi | ............. G01R 29/10 342/360 |

(Continued)

FOREIGN PATENT DOCUMENTS

| | | | |
|---|---|---|---|
| CN | 106970271 A | * | 7/2017 |
| CN | 112994768 A | * | 6/2021 |

(Continued)

OTHER PUBLICATIONS

Rohde & Schwarz, "R&S QAR Quality Automotive Radome Tester", Rohde & Schwarz GmbH & Co. KG, Product Brochure, Jan. 2019.

*Primary Examiner* — Vladimir Magloire
*Assistant Examiner* — Michael W Justice
(74) *Attorney, Agent, or Firm* — Potomac Technology Law, LLC

(57) ABSTRACT

A system for testing a radar under test is provided. The system comprises an antenna array with a plurality of antenna elements, a plurality of transceivers downstream to the plurality of antenna elements and a processing unit. In this context, the processing unit is configured to communicate the radar under test by transmitting and/or receiving a two dimensional test pattern and to compare the two dimensional test pattern with a reference pattern.

11 Claims, 4 Drawing Sheets

(51) Int. Cl.
*G01S 13/02* (2006.01)
*H01Q 3/36* (2006.01)

(56) References Cited

U.S. PATENT DOCUMENTS

| | | | | |
|---|---|---|---|---|
| 5,384,572 A * | 1/1995 | Michaels | G01S 7/4086 | 342/171 |
| 5,432,523 A * | 7/1995 | Simmers | G01R 29/10 | 343/703 |
| 5,748,146 A * | 5/1998 | Grove | H01Q 19/021 | 342/174 |
| 5,808,962 A * | 9/1998 | Steinberg | G01S 15/8925 | 342/179 |
| 5,920,281 A * | 7/1999 | Grace | G01S 7/4052 | 342/172 |
| 6,046,697 A * | 4/2000 | Overbury | H01Q 3/36 | 342/174 |
| 6,107,958 A * | 8/2000 | Kelkar | G01S 7/4052 | 342/75 |
| 6,114,985 A * | 9/2000 | Russell | G01S 7/4052 | 342/173 |
| 6,356,227 B1 * | 3/2002 | Gibson | G01S 13/426 | 342/25 D |
| 8,013,783 B2 * | 9/2011 | Lomes | H01Q 3/267 | 342/165 |
| 8,212,716 B2 * | 7/2012 | Goshen | G01S 7/4004 | 342/165 |
| 8,718,122 B2 * | 5/2014 | Griesing | H04W 24/00 | 375/224 |
| 8,761,684 B2 * | 6/2014 | Reed | H04B 17/0085 | 455/67.14 |
| 8,793,093 B2 * | 7/2014 | Mow | H04B 17/0087 | 455/67.14 |
| 8,907,845 B2 * | 12/2014 | Jones | G01S 13/4463 | 342/368 |
| 9,024,828 B2 * | 5/2015 | Reed | G01R 29/10 | 343/703 |
| 9,110,170 B1 | 8/2015 | Woollard et al. | | |
| 9,209,914 B2 * | 12/2015 | Reed | H04B 17/0085 | |
| 9,255,953 B2 * | 2/2016 | Robinson | H01Q 3/267 | |
| 9,285,461 B2 * | 3/2016 | Swirhun | G01S 7/026 | |
| 9,473,963 B2 * | 10/2016 | Kennedy | H04B 17/29 | |
| 9,614,279 B2 * | 4/2017 | McDevitt | H01Q 3/267 | |
| 9,967,762 B2 * | 5/2018 | Kennedy | H04B 17/3912 | |
| 10,031,171 B2 * | 7/2018 | Robinson | G01R 29/10 | |
| 10,054,623 B2 * | 8/2018 | Estebe | G01S 7/4026 | |
| 10,177,862 B2 * | 1/2019 | Wen | H04B 17/391 | |
| 10,209,284 B2 * | 2/2019 | Gienger | G01R 27/04 | |
| 10,222,468 B2 * | 3/2019 | Assefzadeh | G01S 7/411 | |
| 10,243,628 B2 * | 3/2019 | Reed | H04B 7/043 | |
| 10,256,930 B2 * | 4/2019 | Karajani | H04B 17/0085 | |
| 10,291,335 B1 * | 5/2019 | Wen | H04B 7/0617 | |
| 10,459,021 B2 * | 10/2019 | Lee | G01R 29/10 | |
| 10,462,686 B2 * | 10/2019 | García | H01Q 21/24 | |
| 10,520,586 B2 * | 12/2019 | Haghighi | G01S 7/4056 | |
| 10,578,715 B2 * | 3/2020 | Haghighi | G01S 7/4052 | |
| 10,581,150 B2 * | 3/2020 | Heuel | H01Q 1/42 | |
| 10,637,590 B2 * | 4/2020 | El-Hassan | H04B 17/101 | |
| 10,684,318 B1 * | 6/2020 | Kyrolainen | G01R 29/105 | |
| 10,852,394 B2 * | 12/2020 | Salvesen | G01S 7/285 | |
| 10,866,308 B2 * | 12/2020 | Salvesen | G01S 7/285 | |
| 11,057,119 B2 * | 7/2021 | Jing | H04B 17/26 | |
| 2004/0061644 A1 * | 4/2004 | Lier | H01Q 21/22 | 342/368 |
| 2007/0210959 A1 * | 9/2007 | Herd | H01Q 3/26 | 342/368 |
| 2011/0122016 A1 * | 5/2011 | Lomes | H01Q 3/267 | 342/174 |
| 2011/0200084 A1 * | 8/2011 | Griesing | H01Q 3/267 | 375/224 |
| 2011/0270567 A1 * | 11/2011 | Mow | H04B 17/0087 | 702/120 |
| 2012/0169540 A1 * | 7/2012 | Jones | G01S 13/4463 | 342/372 |
| 2013/0214971 A1 * | 8/2013 | Robinson | H01Q 3/267 | 342/360 |
| 2013/0300616 A1 * | 11/2013 | Reed | H04B 17/3912 | 343/703 |
| 2014/0266866 A1 * | 9/2014 | Swirhun | G01S 7/026 | 342/188 |
| 2014/0273870 A1 * | 9/2014 | Kennedy | H04B 17/3912 | 455/67.11 |
| 2014/0300519 A1 * | 10/2014 | Estebe | G01R 29/10 | 343/703 |
| 2014/0302798 A1 * | 10/2014 | Reed | H04B 17/0085 | 455/67.14 |
| 2016/0043465 A1 * | 2/2016 | McDevitt | G01S 13/91 | 342/368 |
| 2016/0212641 A1 * | 7/2016 | Kong | H04B 17/0087 | |
| 2016/0231423 A1 | 8/2016 | Enderli et al. | | |
| 2017/0115378 A1 * | 4/2017 | Haghighi | G01S 7/4052 | |
| 2017/0150381 A1 * | 5/2017 | Kennedy | H04W 24/06 | |
| 2017/0307732 A1 * | 10/2017 | Haghighi | G01S 7/4056 | |
| 2017/0363719 A1 * | 12/2017 | Ahmed | G01S 7/4052 | |
| 2018/0048398 A1 * | 2/2018 | El-Hassan | H01Q 3/36 | |
| 2018/0080967 A1 * | 3/2018 | Lee | G01R 29/10 | |
| 2018/0115065 A1 * | 4/2018 | Valdes Garcia | H04B 17/12 | |
| 2018/0306903 A1 * | 10/2018 | Heuel | G01S 7/40 | |
| 2018/0337738 A1 * | 11/2018 | Wen | H04B 17/309 | |
| 2019/0004102 A1 * | 1/2019 | Gienger | H01Q 3/2676 | |
| 2019/0041496 A1 * | 2/2019 | Salvesen | G01S 7/4052 | |
| 2019/0058535 A1 * | 2/2019 | Karajani | H04B 17/0085 | |
| 2019/0124529 A1 * | 4/2019 | García | H04W 24/06 | |
| 2019/0173592 A1 * | 6/2019 | Wen | H04B 17/12 | |
| 2020/0028598 A1 * | 1/2020 | Jing | G01R 29/10 | |
| 2020/0363503 A1 * | 11/2020 | Salvesen | G01S 7/4052 | |
| 2021/0270926 A1 * | 9/2021 | Kenington | G01S 3/043 | |

FOREIGN PATENT DOCUMENTS

| | | | | |
|---|---|---|---|---|
| EP | 2199823 A1 * | 6/2010 | | F41G 7/002 |
| JP | 3725851 B2 * | 12/2005 | | |
| KR | 102423671 B1 * | 8/2017 | | H04B 17/21 |

\* cited by examiner

SYSTEM AND METHOD FOR TESTING A RADAR UNDER TEST

RELATED APPLICATIONS

This application claims priority under 35 U.S.C. § 119(a) from European Patent Application No. 19179340.5 (filed 2019 Jun. 11), the entirety of which is incorporated by reference herein.

TECHNICAL FIELD

The invention relates to a system and a corresponding method for testing a radar under test, especially for testing the functionality of small solid state transmitter-receiver modules of an active electronically scanned array (AESA) radar.

BACKGROUND

Radar imaging has been extensively used for terrain aided navigation to provide a navigation position update. The cells in the range corresponding to the antenna main beam return are converted into a high resolution image and correlated to the selected terrain segment in the data base reference frame to provide an updated navigation position estimate. For example, U.S. Pat. No. 9,110,170 B1 shows such terrain aided navigation using multi-channel monopulse radar imaging.

Generally, radars comprising active phase arrays are tested with a near-field probe at each individual transmitting-receiving modules. Based on the near-field measurements, the far-field radiation pattern is simulated. For probing the individual transmitter-receiver modules, a cut waveguide is utilized having dimensions quarter wavelength of the center frequency. Due to the high number of transmitter-receiver modules, which depends on the type and application of the radar to be tested, such probing takes a day or even more to complete the measurement. Furthermore, the small solid state transmitter-receiver modules are typically integrated into planks with limited access to the analog radio frequency part. Therefore, the performance testing is limited to over the air measurements that leads to a time consuming process with added complexities of digitization and phase alignment.

Accordingly, there is a need to provide a system and a method for testing a radar under test, especially utilizing radar imaging for testing the performance of transmitter-receiver modules of an active phased array radar to significantly reduce the measurement time and further improving test quality and accuracy simultaneously.

SUMMARY

Embodiments of the present invention advantageously address the foregoing requirements and needs, as well as others, by providing a system and a method for testing a radar under test, especially utilizing radar imaging for testing the performance of transmitter-receiver modules of an active phased array radar to significantly reduce the measurement time and further improving test quality and accuracy simultaneously.

According to a first aspect of the invention, a system for testing a radar under test is provided. The system comprises an antenna array with a plurality of antenna elements, a plurality of transceivers downstream to the plurality of antenna elements and a processing unit. In this context, the processing unit is configured to communicate the radar under test by transmitting and/or receiving a two dimensional test pattern and to compare the two dimensional test pattern with a reference pattern. Advantageously, an extensive performance testing of each individual transmitter-receiver module of the radar under test is carried out by utilizing a two dimensional test pattern. The resulting radiation pattern, for example radiated from the radar under test is compared with a predefined reference pattern to evaluate each transmitter-receiver module functionality.

According to a first preferred implementation form of said first aspect of the invention, the plurality of transceivers are adapted to receive signals from the antenna array and/or transmit signals through the antenna array via each corresponding antenna elements. In this context, each transceiver comprises an uplink path and a downlink path corresponding to the transmit and receive signals to and from the associated antenna element. The plurality of transceivers and the plurality antenna elements advantageously provide a high redundancy.

According to a second preferred implementation form of said first aspect of the invention, the processing unit is further configured to control a gain and a phase of the plurality of transceivers in order to generate the two dimensional test pattern. Advantageously, orientation and the focus of the beamforming beam are digitally controlled to achieve fast response time and quick operation to emit, for instance, extremely low power millimeter-waves in very short succession.

According to a further preferred implementation form of said first aspect of the invention, the plurality of antenna elements are arranged in a two dimensional configuration to facilitate two dimensional beamforming. Advantageously, two dimensional antenna patterns are effectively generated.

According to a further preferred implementation form of said first aspect of the invention, the two dimensional test pattern corresponds to a digital image that results in a radiation pattern in the form of a complex radio frequency image. Advantageously, the complex radio frequency image effectively exercise radar parameters such as beam steering, amplitude control, spectral purity and so on.

According to a further preferred implementation form of said first aspect of the invention, the processing unit is further configured to process the complex radio frequency image into horizontal and vertical image components. The horizontal and vertical image components correspond to the raw radio frequency image that is conditioned and digitized for post-processing, which results in a complex valued image. Advantageously, such image processing expedites the assessment of the test pattern with respect to the reference pattern and significantly reduces overall test time.

According to a further preferred implementation form of said first aspect of the invention, the system further comprises a radio frequency lens situated in-between the radar under test and the antenna array. Advantageously, the beamforming beam to and from the antenna array is substantially linear even in the near-field.

According to a further preferred implementation form of said first aspect of the invention, the system further comprises an anechoic chamber encompassing the antenna array, the radio frequency lens and the radar under test. Advantageously, over the air testing of the radar under test is performed in a controlled or null interference situation of the test area.

According to a further preferred implementation form of said first aspect of the invention, the system further comprises a user interface, preferably a graphical user interface.

Advantageously, controlling test parameters and analyzing test results are performed with ease through direct manipulation of the graphical elements.

According to a further preferred implementation form of said first aspect of the invention, the system further comprises a memory unit in order to store the two dimensional test pattern, the reference pattern and the history of test results. A test pattern can be used multiple times for correlation adjustment with respect to the reference pattern. In addition, multiple test patterns can be stored beforehand and can be successively used to fully test the functionality of the radar under test. Furthermore, previous test results can be accessed at any time to effectively identify any error that may occur during the current measurement. Advantageously, test accuracy is significantly improved.

According to a second aspect of the invention, a method for testing a radar under test using an antenna array with a plurality of antenna elements is provided. The method comprises the steps of communicating the radar under test by transmitting and/or receiving a two dimensional test pattern through the antenna array and comparing the two dimensional test pattern with a reference pattern. Advantageously, an extensive performance testing of each individual transmitter-receiver module of the radar under test is carried out by utilizing a two dimensional test pattern. The resulting radiation pattern, for example radiated from the radar under test is compared with a predefined reference pattern to evaluate each transmitter-receiver module functionality.

According to a first preferred implementation form of said second aspect of the invention, the method further comprises the step of controlling a gain and a phase of the plurality of transceivers in order to generate the two dimensional test pattern. Advantageously, orientation and the focus of the beamforming beam are digitally controlled to achieve fast response time and quick operation to emit, for instance, extremely low power millimeter-waves in very short succession.

According to a second preferred implementation form of said second aspect of the invention, the method further comprises the step of arranging the plurality of antenna elements in a two dimensional configuration to facilitate two dimensional beamforming. Advantageously, two dimensional antenna patterns are effectively generated.

According to a further preferred implementation form of said second aspect of the invention, the method further comprises the step of utilizing a digital image as the two dimensional test pattern that results in a radiation pattern in the form of a complex radio frequency image. Advantageously, the complex radio frequency image effectively exercise radar parameters such as beam steering, amplitude control, spectral purity and so on.

According to a further preferred implementation form of said second aspect of the invention, the method further comprises the step of processing the complex radio frequency image into horizontal and vertical image components. The horizontal and vertical image components correspond to the raw radio frequency image that is conditioned and digitized for post-processing, which results in a complex valued image. Advantageously, such image processing expedites the assessment of the test pattern with respect to the reference pattern and significantly reduces overall test time.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Exemplary embodiments of the invention are now further explained with respect to the drawings by way of example only, and not for limitation. In the drawings.

DETAILED DESCRIPTION

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in computer memory storage.

Reference will now be made in detail to the embodiments of the present invention, examples of which are illustrated in the accompanying drawings. However, the following embodiments of the present invention may be variously modified and the range of the present invention is not limited by the following embodiments.

Figure 1:
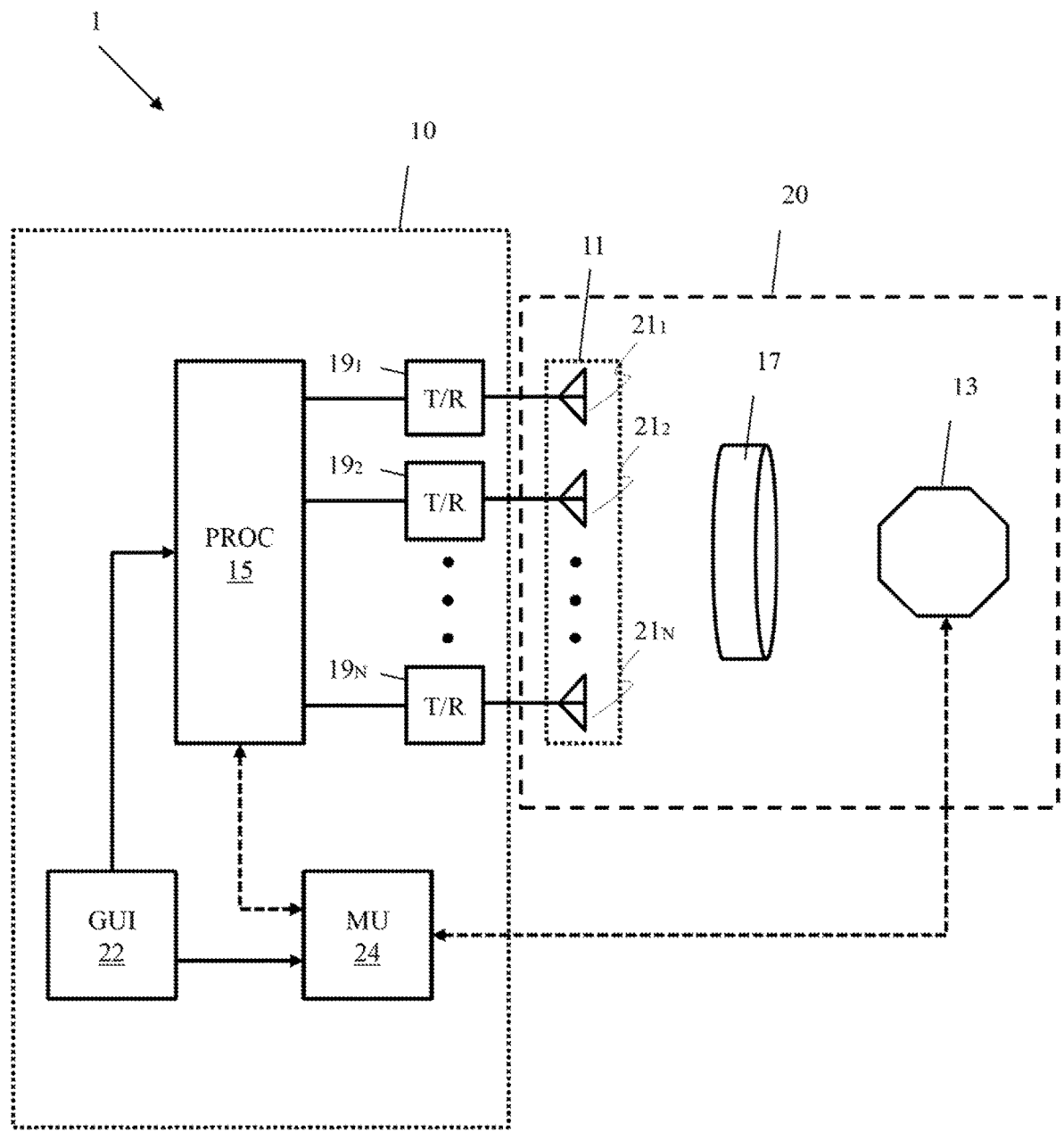
FIG. 1 shows a block diagram of the system according to the first aspect of the invention.

In FIG. 1, a block diagram of the system 1 according to the first aspect of the invention is illustrated. The system 1 comprises an antenna array 11 with a plurality of antenna elements $21_1$, $21_2$, . . . , $21_N$. The antenna elements $21_1$, $21_2$, . . . , $21_N$ are arranged in a two dimensional configuration on the antenna array 11 with uniform spacing. Additionally or alternatively, the antenna elements $21_1$, $21_2$, . . . , $21_N$ can be arranged in a two dimensional configuration on the antenna array 11 with phased weights, which depend on the angle of arrival and/or angle of departure to define the constructive or destructive addition of the antenna signals.

The system 1 further comprises a plurality of transceivers $19_1, 19_2, \ldots, 19_N$ downstream to the plurality of antenna elements $21_1, 21_2, \ldots, 21_N$. Each of the plurality of transceivers $19_1, 19_2, \ldots, 19_N$ is serially connected to each corresponding plurality of antenna elements $21_1, 21_2, \ldots, 21_N$ via an uplink path and a downlink path, which are not shown in FIG. 1. The transceivers $19_1, 19_2, \ldots, 19_N$ generally comprise controllable attenuators and phase shifters for orienting and focusing the beamforming beam, a power amplifier for transmission and a low-noise amplifier for reception. The functionality of the amplifiers, attenuators and phase shifters are known in the art and therefore are not described herein in greater details.

The plurality of transceivers $19_1, 19_2, \ldots, 19_N$ are connected through data bus lines to a processing unit 15, which digitally controls the controllable attenuators and phase shifters of the transceivers $19_1, 19_2, \ldots, 19_N$ to regulate the corresponding gain and phase of the transceivers $19_1, 19_2, \ldots, 19_N$ in order to generate a two dimensional test pattern via the two dimensionally arranged antenna elements $21_1, 21_2, \ldots, 21_N$.

The system 1 further comprises an anechoic chamber 20 that encompasses the antenna array 11, a radio frequency lens 17 and a radar under test 13. The radio frequency lens 17 effectively linearizes the beamforming beam in the near-field and thereby allows the test system 1 to be arranged in the near-field. The radar under test 13 is preferably an active electronically scanned array radar.

The processing unit 15 is connected to a memory unit 24, which is further connected to the radar under test 13. The term "connected" herein represents an interconnection through a media that allows baseband transmission, for instance Ethernet cables, Coaxial cables and the like. The system 1 further comprises a graphical user interface 22 connected to the processing unit 15 and to the memory unit 24. The graphical user interface 22 can be connected directly through data cables or remotely via wireless local area network. Preferably, the graphical user interface 22 comprises menu based interfaces and direct manipulation interfaces so as to facilitate the users to configure the test system 1 to meet their specific requirements in diverse test circumstances.

The plurality of transceivers $19_1, 19_2, \ldots, 19_N$, the processing unit 15, the graphical user interface 22 and the memory unit 24 are also referred to as tester 10 in general.

Figure 2:
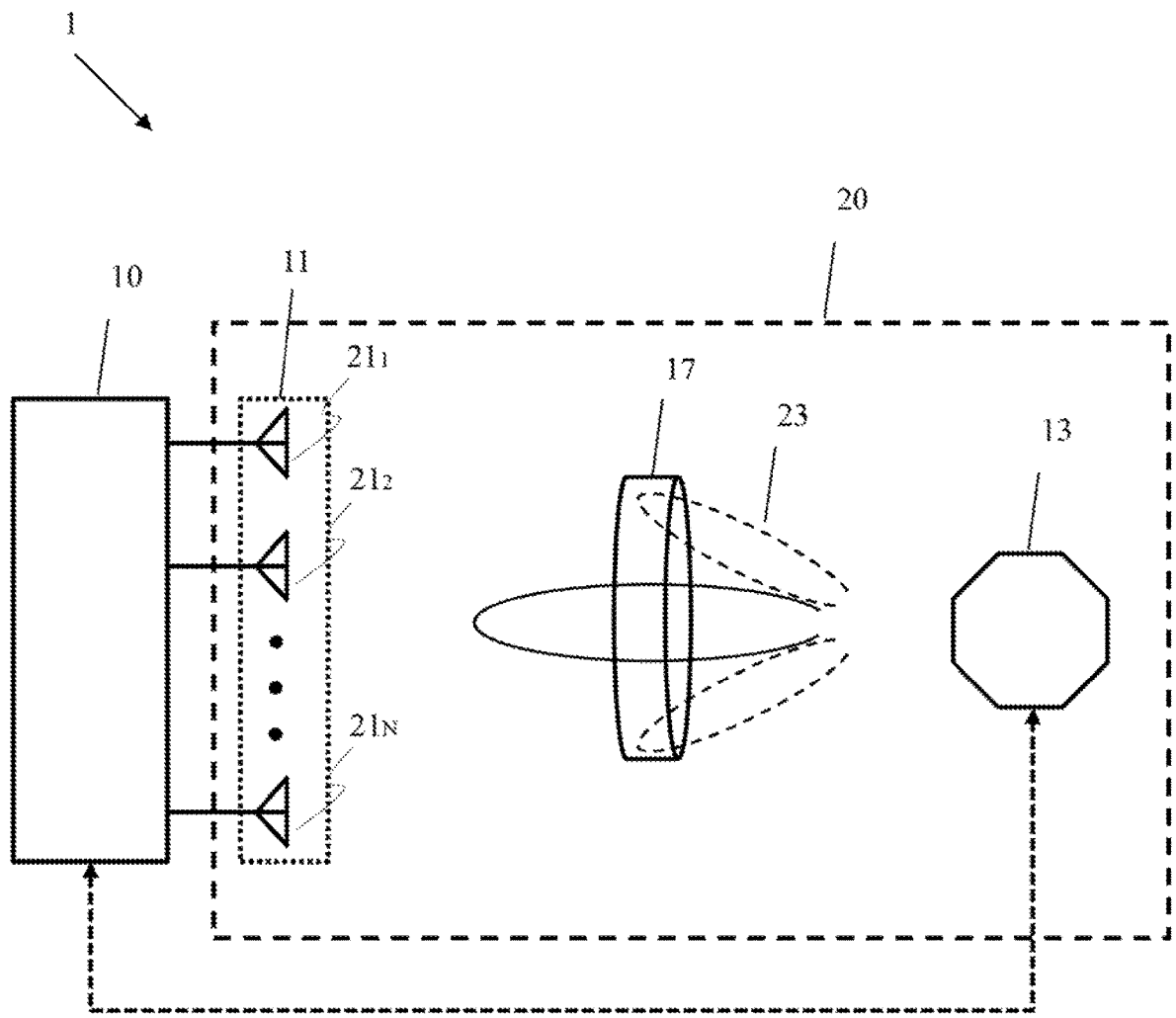
FIG. 2 shows a block diagram of the system performing a transmission test on a radar under test according to the first aspect of the invention.

In FIG. 2, a block diagram of the system 1 performing a transmission test on a radar under test 13 according to the first aspect of the invention is illustrated. The tester 10 uploads a digital image to the processor of the radar under test 13. The radar under test 13 generates a radiation pattern 23 corresponding to the digital image which results in a complex radio frequency image. The antenna array 11 of the tester 10 captures the complex radio frequency image where the processing unit 15 performs signal processing to analyze the received radio frequency image with respect to the known pattern of the digital image. The aforementioned process is repeated several times to perform comprehensive transmission test on each transmitter-receiver module of the radar under test 13.

Figure 3:
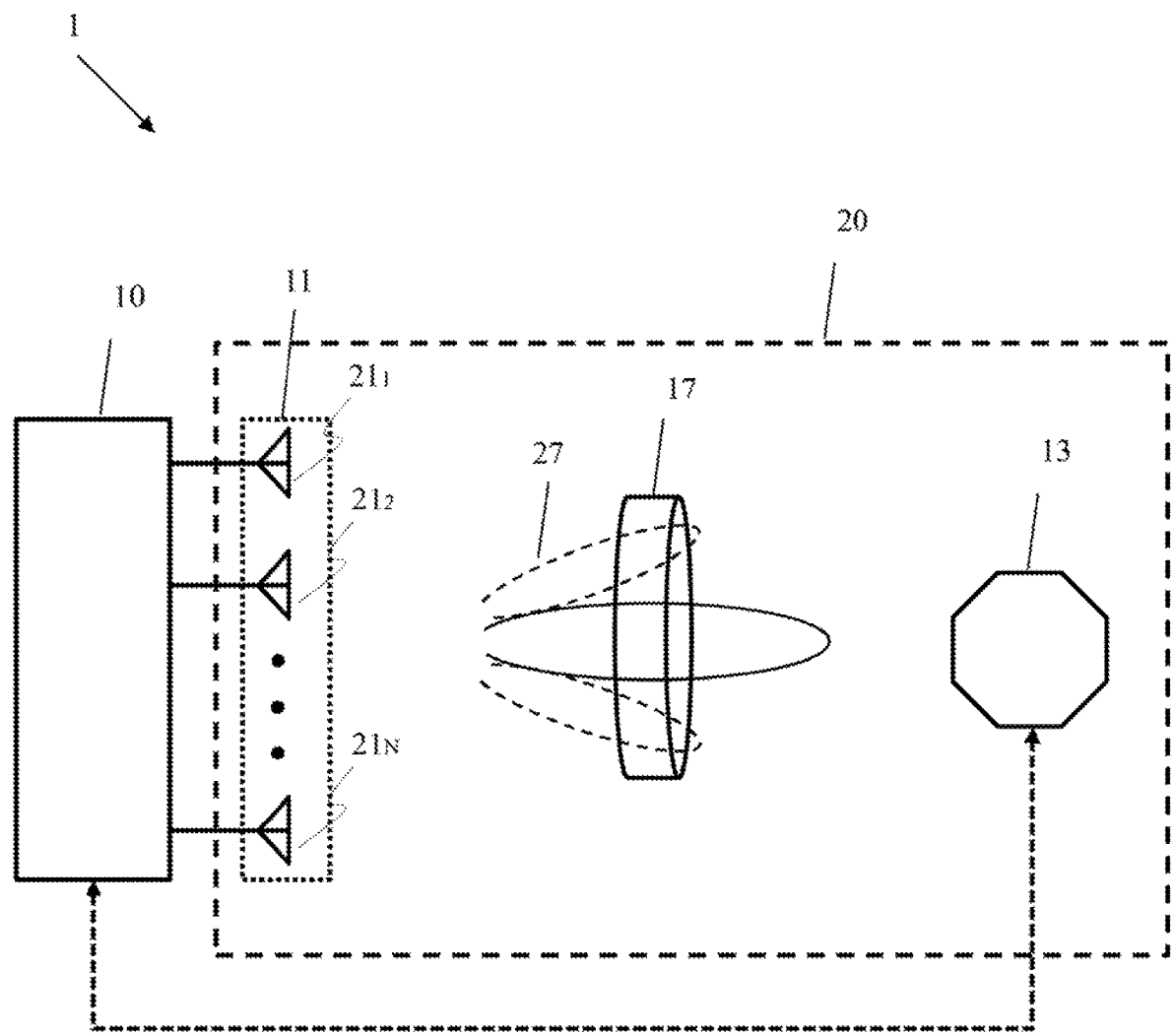
FIG. 3 shows a block diagram of the system performing a reception test on a radar under test according to the first aspect of the invention.

In FIG. 3, a block diagram of the system 1 performing a reception test on a radar under test 13 according to the first aspect of the invention. In this setup, the tester 10 transmits a digital image to the radar under test 13 to perform comprehensive reception test on each transmitter-receiver module of the radar under test 13. The processing unit 15 of the tester 10 controls the gain and phase of the plurality of transceivers $19_1, 19_2, \ldots, 19_N$ in order to generate a radiation pattern 27, simulating radar reflection on the transmitter-receiver modules of the radar under test 13. The radar under test 13 receives the corresponding complex radio frequency image and the image is further analyzed with respect to the known pattern of the digital image. This process is also repeated several times to fully test each transmitter-receiver module. It is to be noted that the transmission test and the reception test can be performed separately and/or simultaneously. For simultaneous transmission and reception testing, several digital test images are used to improve correlation analysis for image processing.

Figure 4:
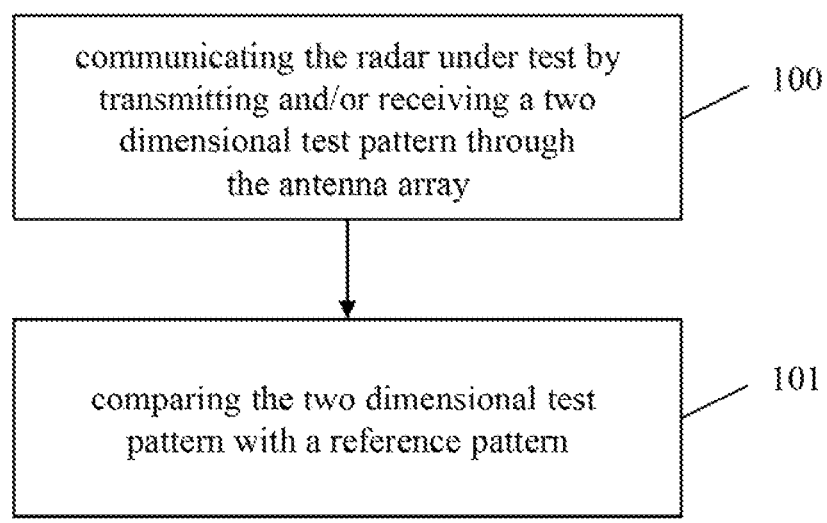
FIG. 4 shows a flow chart of an exemplary embodiment of the second aspect of the invention.

In FIG. 4, a flow chart of an exemplary embodiment of the inventive method according to the second aspect of the invention is illustrated. In a first step 100, the radar under test is communicated through the antenna array by transmitting and/or receiving a two dimensional test pattern. In a second step 101, the two dimensional test pattern is compared with a reference pattern.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A system for testing a radar under test comprising:
   an antenna array with a plurality of antenna elements;
   a plurality of transceivers correspondingly connected to the plurality of antenna elements; and
   a processor; and
   wherein the processor is configured to control the system to perform reception testing of the radar under test by (i) controlling the gain and phase of the plurality of transceivers to generate a first radiation pattern to simulate a radar reflection on the radar under test, (ii) controlling transmission, via the antenna array, of the first radiation pattern to the radar under test, wherein the first radiation pattern corresponds to a digital image and is in the form of a first complex radio frequency image, (iii) receiving, via the antenna array, a second radiation pattern from the radar under test, and (iv) analyzing the second radiation pattern with respect to a known test pattern of the digital image.

2. The system according to claim 1, wherein each of the plurality of transceivers is adapted to receive signals from the antenna array and/or transmit signals through the antenna array via the corresponding antenna to which it is connected.

3. The system according to claim 1, wherein the plurality of antenna elements are arranged in a two dimensional configuration to facilitate two dimensional beamforming.

4. The system according to claim 1, wherein the system is further configured to process the first and/or second complex radio frequency images into horizontal and vertical image components.

5. The system according to claim 1, wherein the system further comprises:
a radio frequency lens situated between the radar under test and the antenna array.

6. The system according to claim 5, wherein the system further comprises:
an anechoic chamber encompassing the antenna array, the radio frequency lens and the radar under test.

7. The system according to claim 1, wherein the system further comprises:
a graphical user interface.

8. The system according to claim 1, wherein the system further comprises:
a memory configured to store the test pattern, the digital Image and a history of test results.

9. A method for testing a radar under test comprising the steps of:
performing reception testing of the radar under test using a test system, by (i) controlling the gain and phase of a plurality of transceivers of the test system to generate a first radiation pattern to simulate a radar reflection on the radar under test, (ii) transmitting, via an antenna array of the test system, the first radiation pattern to the radar under test, wherein the first radiation pattern corresponds to a digital image and is in the form of a first complex radio frequency image, (iii) receiving, via the antenna array, a second radiation pattern from the radar under test, and (iv) analyzing the second radiation pattern with respect to a known test pattern of the digital image.

10. The method according to claim 9, wherein the method further comprises the step of:
arranging a plurality of antenna elements of the antenna array in a two dimensional configuration to facilitate two dimensional beamforming.

11. The method according to claim 9, wherein the method further comprises the step of:
processing the first and/or second complex radio frequency images into horizontal and vertical image components.

* * * * *